United States Patent [19]

Rademacher

[11] Patent Number: 5,930,466

[45] Date of Patent: Jul. 27, 1999

[54] METHOD AND APPARATUS FOR DATA COMPRESSION OF BITMAPS USING ROWS AND COLUMNS OF BIT-MAPPED PRINTER DATA DIVIDED INTO VERTICAL SLICES

[75] Inventor: Timothy John Rademacher, Lexington, Ky.

[73] Assignee: Lexmark International Inc, Lexington, Ky.

[21] Appl. No.: 08/814,850

[22] Filed: Mar. 11, 1997

[51] Int. Cl.$^6$ .................................................. G06K 15/00
[52] U.S. Cl. ......................................... 395/114; 395/115
[58] Field of Search ................................... 395/114, 115, 395/109, 110, 112, 116

[56] References Cited

U.S. PATENT DOCUMENTS

| | | | |
|---|---|---|---|
| 4,476,542 | 10/1984 | Crean et al. | 364/900 |
| 4,520,455 | 5/1985 | Crean et al. | 364/900 |
| 4,527,251 | 7/1985 | Nibby, Jr. et al. | 364/900 |
| 4,553,171 | 11/1985 | Holladay et al. | 358/263 |
| 4,622,545 | 11/1986 | Atkinson | 340/747 |
| 4,703,515 | 10/1987 | Baroody, Jr. | 382/46 |
| 4,779,105 | 10/1988 | Thomson et al. | 346/154 |
| 4,870,498 | 9/1989 | Schoon | 358/261.4 |
| 4,910,505 | 3/1990 | Beaven et al. | 340/750 |
| 5,020,121 | 5/1991 | Rosenberg | 382/56 |
| 5,081,700 | 1/1992 | Crozier | 395/150 |
| 5,084,831 | 1/1992 | Morikawa et al. | 395/116 |
| 5,150,427 | 9/1992 | Frazee et al. | 382/48 |
| 5,272,768 | 12/1993 | Bauman et al. | 395/110 |
| 5,315,701 | 5/1994 | DiNicola et al. | 395/163 |
| 5,321,807 | 6/1994 | Mumford | 395/162 |
| 5,465,322 | 11/1995 | Hsu et al. | 395/114 |
| 5,471,320 | 11/1995 | Jodoin et al. | 358/455 |
| 5,479,587 | 12/1995 | Campbell et al. | 395/116 |
| 5,483,622 | 1/1996 | Zimmerman et al. | 395/114 |
| 5,491,758 | 2/1996 | Bellegarda et al. | 382/187 |
| 5,493,419 | 2/1996 | Jodoin et al. | 358/455 |
| 5,500,928 | 3/1996 | Cook et al. | 395/133 |
| 5,502,804 | 3/1996 | Butterfield et al. | 395/147 |
| 5,619,622 | 4/1997 | Audi et al. | 395/108 |
| 5,687,303 | 11/1997 | Motamed et al. | 395/117 |
| 5,732,202 | 3/1998 | Okamoto | 385/117 |

Primary Examiner—Leo H. Boudreau
Assistant Examiner—Bhavesh Mehta
Attorney, Agent, or Firm—Frederick H. Gribbell; Ronald K Aust

[57] ABSTRACT

An improved printing system is provided that compresses bitmap print data by determining, per each vertical slice of a horizontal swath of the printed page, which one of two different data compression techniques to more efficiently compresses each individual slice, then temporarily stores this compressed data in a memory circuit until needed by the printhead for actual printing of the final output in the form of print media. When using slices containing seven (7) different words per slice, the present invention utilizes a single "control bit" of a "control word" to represent each of the data words of the slice. Depending upon which type of compression technique is used, the control bit for each data word will be set to either Logic 1 or Logic 0, depending upon the value of the data word as compared to a predetermined data word value that is chosen by the system, and which may be used in both types of data compression techniques. After each slice has been analyzed by both types of data compression techniques, certain of the data words in the slice can be temporarily discarded, leaving behind less than seven (7) data words to represent that slice as compressed data. This compressed data for each individual slice will be matched up with a "control word" that is made up of the individual control bits described above, thereby creating a relatively small data set that can be stored in memory in a space that would be less than the amount of memory required to store the uncompressed slices for the same print data. Later, these (compressed) data sets (one per individual slice) can be decompressed according to the proper decompression technique, and the full print data is then restored just before printing by the printhead. As part of the control word, a "mode bit" can be set to either binary value of Logic 1 or Logic 0, thereby indicating which of the two data compression techniques was initially used for that slice. The two data compression techniques used are called a "USE-X MODE" and a "REPEAT MODE."

13 Claims, 9 Drawing Sheets

METHOD AND APPARATUS FOR DATA COMPRESSION OF BITMAPS USING ROWS AND COLUMNS OF BIT-MAPPED PRINTER DATA DIVIDED INTO VERTICAL SLICES

TECHNICAL FIELD

The present invention relates generally to imaging and printing equipment and is particularly directed to printers of the type which use a printhead having an array of ink-spraying nozzles. The invention is specifically disclosed as an ink jet printer that prints swaths of print data in which the swaths are composed of a large number of slices. The printer or a host computer compresses each slice of the original bitmap print data according to at least two different compression techniques to see which has the greater compression ratio for each individual slice, after which the compressed data is temporarily stored in memory until it is ready to be printed, at which time each of the slices is decompressed according to the appropriate decompression technique, and thereby printing the image according to the original print data.

BACKGROUND OF THE INVENTION

Ink jet printers using an array of multiple nozzles have been available for years, as have other types of printers using an array of multiple printing devices, such as thermal elements. In such printers, these nozzles are typically grouped together on a printhead, which typically is affixed to a moveable carriage or carrier that moves left and right in a horizontal manner with respect to a sheet of paper that is moving or indexing in a perpendicular, vertical direction. The multiple nozzles are typically grouped in a vertical column (or multiple such vertical columns) so that, on one horizontal pass of the printhead via its carrier, multiple horizontal "columns" of dots or pels (i.e., print elements), can be simultaneously laid down in a "swath" of ink upon the paper or other print media.

As the printhead travels in the horizontal direction, it produces tiny dots along the swath according to "print data" that has been received by the printer, typically from a host computer. The "width" (i.e., "height," in this orientation) of the swath is dependent upon the resolution of the printhead nozzles (such as 300 dpi (dots per inch)), which is 1/300 inch resolution, as well as the number of nozzles in the vertical column array on the printhead. If, for example, the printhead has an array of 104 nozzles, and its resolution is 300 dpi, then the swath would be approximately 1/3 inch in width. Typical conventional printers format the print data so that each of the nozzles receives a digital (i.e., either "on" or "off") datum bit of information virtually simultaneously, which means that, in the above example, a data set of at least 104 bits must be sent to the printhead to control the 104 nozzles that are ready to either print a dot by turning ON (e.g., Logic 1), or to not print a dot which would be the nozzle's OFF state (e.g., Logic 0). This data set for a particular instant of time to control the entire vertical column array of 104 nozzles is designated by the term "slice." Therefore, to create a swath of print data, slice after slice of print data must be sent to the printhead to sequentially turn ON or OFF each of the printhead's nozzles at the correct times to reproduce the print data pattern representation that was earlier received by the printer from its host computer. In the above example, each slice must contain 104 bits of print data and, assuming that the horizontal resolution was also 300 dpi, there would then have to be 300 slices of data per horizontal inch of printhead travel via its carrier, thereby creating a rectangle of 104×300 pels, or 1/3 inch×1 inch.

In conventional ink jet printers, it is typical to import print data from a host PC and to store that print data by receiving "words" or "bytes" of print data, where each bit of the word or byte represents a single pel once the data is in the form of a "bitmap." Bitmap information typically arrives as a series of words of sixteen (16) bits each until a complete slice has been defined. Once the first slice of a swath has been received and stored in the printer's memory system, additional words are then received to define the next consecutive slice, and this procedure continues until all of the slices for a swath have been received and then stored in the printer's memory system. After the first swath has been completed, the subsequently received print data will again be in groupings of words to define the first slice of the next swath, which typically is the adjacent swath to the one that has just been completed.

This process continues until all of the slices for all of the swaths have been received for an entire page to be printed. If no data compression or data compacting techniques are used, the bitmap received by the printer and subsequently stored in the printer's memory system will represent a series of vertical slices adjacent to one another to make up a swath, and a series of horizontal swaths that are adjacent to one another to define the entire vertical structure of the page to be printed. All of these slices and swaths are composed of individual pels, whether or not these pels are to be printed or to be blank, thereby forming an entire rectangular page of bitmap print data. This approach is very memory intensive, because all of the "blank" areas where there are no pels to be printed nevertheless require the same amount of memory space as areas that have various pels being printed by the printhead. Without any type of data compression or data compacting techniques, the amount of memory area required to store a single page of print data will always be the number of pels required to make up all of the slices of each swath times the number of swaths for that page. For example, if an entire 8½×11 inch page of print data were to be stored in memory, at 300 dpi there would be (8.5×300)×(11×300)=8,415,000 pels required. This roughly eight million bits of data would correspond to just over one million bytes of memory space required in the printer's memory system, and that is assuming no extra bits are used for any (typical) error checking routines. It is easy to see that there are advantages to reducing the amount of memory space required to hold print data in such printing systems.

In a patent by Bauman (U.S. Pat. No. 5,272,768), a data compression technique is disclosed that compresses character font data, then stores that compressed font character, and later decompresses the font character just before it is printed by a printhead. This Bauman data compression technique is typically used by an ink jet printer or perhaps by a printer using an array of LEDs, in which the rows to be printed are grouped in horizontal swaths. In one example provided in Bauman, each character comprises three (3) swaths of data, designated as "strips." Each of these strips is comprised of 16 bits or pels of print data, and each character font is analyzed to see if it requires all three (3) strips to be defined as containing at least one pel of "black" or printed data. If so, then that particular character's font is not compressed. On the other hand, if one or more of these strips is entirely blank for a particular character font, then that character is compressed by deleting the one or more strips that are not required to print that character. The printer's font ROM (i.e., read only memory) stores these character fonts in their compressed state, thereby saving some memory space within the font ROM.

As disclosed in Bauman, the print job data is received from a host computer and temporarily stored in an input buffer. This data would typically be ASCII data at this point, and not bitmap data. In these situations, the ASCII data must be interpreted or "RIPed" (i.e., undergo raster image processing), so that each character will have a bitmap created for it by the font ROM. Somewhere within the printer, the character must become a bitmap image before being sent to the print engine. In Bauman, as the ASCII characters arrive at the printer, for each font that is available in the printer's font ROM, such ASCII characters will be converted into a bitmap by use of the compressed image stored in the font ROM, which then must be uncompressed by the printer before being sent to the print engine. This is achieved by keeping track as to which of the three strips for each particular character font has been deleted to create the compressed font for that ASCII character. A data table is used to store this information, and when the bitmap is created for that particular character font, the "deleted" strip is then added to the bitmap of the entire character before being sent to the print engine. The Bauman invention works only with pre-determined character data, such as alphanumeric characters of different type font and point size, and which is imported into the printer as ASCII data or some other high level language data format.

Another U.S. patent, by Nagata (U.S. Pat. No. 5,237,645), discloses a printer that uses a light-emitting diode (LED) array, or a laser head or other similar device. Typical conventional laser printers do not print data in swaths, but instead by individual rows of single pels. If an array of LEDs is used, then the printing process can be done in swaths. In either case, Nagata teaches a method for compressing bitmap data before such data is stored in image memory. The print data is either received as already bitmapped data, or it arrives from a host computer in some type of high level page description language, such as PostScript™. If the data arrives in a high level language, then a bitmap must first be created by RIPing the data. Once the data is in a bitmap format, Nagata receives an entire page of data in an uncompressed state into a virtual page of memory. At this point, the entire page of data is divided into "virtual blocks," and this essentially is done by choosing a block size. Once the virtual block size has been chosen, the Nagata system must RIP enough "rasters" (i.e., lines that are one (1) pixel or pel in height) until there are enough to fill the entire height of a block (which now consists of a partial bitmap). Once these blocks have been determined, the Nagata printer analyzes each of the virtual blocks to decide whether or not any of the blocks are completely blank (i.e., containing no data to be printed within that particular area). Such blank blocks are designated as "empty" blocks. All non-empty blocks are then designated as "effective" blocks. Only effective blocks are stored in the image memory, although the location for each empty block is stored in a different set of memory registers. In this manner, a large amount of image memory can potentially be saved for each page of data to be printed.

By compressing the data according to the Nagata invention, more than one page of print data typically can fit within the limited space available in the image memory. Of course, this compressed data must later be uncompressed before being sent to the print engine. According to Nagata, the effective blocks are retrieved from image memory as needed in full bitmap format, per each raster section as required. When the printer arrives at an empty block, such raster sections are merely loaded with zeros to provide print data for the block, and then that data is transferred to the print engine. In this manner, the print engine always receives full bitmap data for the entire page to be printed. Accordingly, the print engine must physically pass over every physical pel location of the page to be printed, regardless of whether or not a pel is to be printed at that location. It will take the print engine just as long to "print" a large area of blank data as it would for that print engine to lay down black pels in various places upon an equivalent area of the page.

In U.S. Pat. No. 3,827,357 (by Mahoney), a printer is disclosed which stores an entire character at each line/column position. If the character is a blank or is an unprintable character (e.g., for some type of invalid code), then that character will not be printed. As each line of data is stored, a counter is decremented for each byte (i.e., character) that can be printed. During printing, the counter is again decremented for each character until it has been determined that all printable characters for this line have been printed. At that point, the rest of the line is abandoned, and the printer shifts its printhead immediately to the next line. Mahoney is an older patent that was primarily directed toward dot matrix or formed character printers. Mahoney essentially discloses one method for determining the right-most character of each line, and when that character has been reached by the printhead, then a line feed can immediately be commanded to occur.

Another example of a conventional ink jet printer is disclosed in Bohrer (U.S. Pat. No. 4,481,602). Bohrer essentially discloses a method for compressing font data before being stored in memory, then later decompresses that data before printing. Bohrer professes to use a method that minimizes the size of the pointer table to provide an overall three-times storage compression. As related above, any appreciable storage compression is valuable, because one can store more than a single page of print data into an image buffer that may have been designed to hold only one (uncompressed) page of print data in bitmap form, thereby increasing printing overall speed by more efficiently processing the print data. Of course, the Bohrer printer must perform a large amount of data manipulation to achieve its stated goal. According to the Bohrer method, each character is matched with its particular font, and a pointer and correction factor offset is created for each of these characters. This information is stored in a "scroll array" of compressed data and also in a "pointer table." When it is time to uncompress the data, the size of the character must be found in the scroll array, the position of the character in its "fill character box" must be determined, and the character is then copied into the bitmap, utilizing all of the stored data including the pointer and the correction factor offset. While Bohrer may save memory space in the image table, it also requires a large amount of processing that may slow down the overall printing procedure.

In U.S. Pat. No. 4,870,498 (by Schoon) a printer is disclosed that decompresses ASCII or other data into run-length-encoded data which, unlike a bitmap, only provides in a scan line one piece of information at each transition from binary 0 to binary 1, or from binary 1 to 0.

In U.S. Pat. No. 4,553,171 (by Holliday) a copier/printer is disclosed that divides digital information into blocks. Each different type of block data is assigned a unique identification code, and put into a scratch pad memory. Blocks having identical data are assigned the same identification code for later use.

In U.S. Pat. No. 5,479,587 (by Campbell) a printer is disclosed that uses more than one data compression technique. If the first data compression operation does not achieve an acceptable level of compression, then other techniques are used to achieve enough compression. Various types of compression techniques are disclosed, including "M-compression" and "LZW-compression."

In Zimmerman (U.S. Pat. No. 5,483,622) a printer is disclosed that has more than one compression technique. When the random access memory (RAM) is insufficient to store portions of input data, it attempts to do a font compression, or compression by a different method, in an attempt to remove the "memory low/out" signal. Some of the compression techniques disclosed in Zimmerman include an "M-compression" and a "bit run length" compression.

In U.S. Pat. No. 5,465,322 (by Hsu) a printer is disclosed that divides the bitmap into numerous image data segments at break entries in the compressed bitmap image data. The break entries are listed in a table of the bitmap, and a plurality of imaging channels are used to decompress selected segments of the bitmap in parallel.

U.S. Pat. No. 5,500,928 (by Cook) discloses a digital printing system in which print images are divided into segments. A "display list" is defined for each segment, in which the display list is compressed when memory capacity is exceeded. If the display list entries grow to a size that exceeds a pure pixel representation, then the display list is reconverted to pixels, using an adaptive compression technique.

While the data compression techniques described above have desirable features, it would also be desirable to compress print data in a slice-by-slice manner, which can later be decompressed slice-by-slice to create swaths of bitmap print data needed at the printhead of the printer. It would be even further advantageous to be able to select, in real time, from more than one data compression technique on a slice-by-slice basis. Such a procedure could be used on graphical data, and not merely pre-determined character (i.e., font) data.

SUMMARY OF THE INVENTION

Accordingly, it is a primary object of the present invention to provide a printing system that saves image memory space in a printer by compressing the bitmap print data so that a document's total bitmap size will be significantly reduced, thereby requiring less memory capacity to store each individual page.

It is another object of the present invention to provide a printing system that compresses bitmap print data on a slice-by-slice basis such that this same compressed data can later be decompressed (also on a slice-by-slice basis) to create individual swaths that make up a portion of each printed page.

It is a further object of the present invention to provide a printing system that compresses bitmap print data on a slice-by-slice basis, in which more than one data compression technique is performed in real time for each individual slice being compressed, and similarly, each compressed slice is later decompressed according to the appropriate compression/decompression technique, also on a individual slice basis.

It is yet another object of the present invention to provide a method for compressing bitmap print data by analyzing the individual slices of each swath to be printed to determine which one of two different data compression techniques is more efficient in to compressing each individual slice, and later to decompress each of these individual slices according to the appropriate compression/decompression technique, so that the final image table bitmap presented to the printhead will identically correspond to the original print data.

Additional objects, advantages and other novel features of the invention will be set forth in part in the description that follows and in part will become apparent to those skilled in the art upon examination of the following or may be learned with the practice of the invention.

To achieve the foregoing and other objects, and in accordance with one aspect of the present invention, an improved printing system is provided that compresses bitmap print data by determining, per each slice of a swath of the printed page, which one of two different data compression techniques more efficiently compresses each individual slice, then temporarily stores this compressed data in a memory circuit until needed by the printhead for actual printing of the final output in the form of print media. In a preferred embodiment, an ink jet printer utilizes a printhead having 104 nozzles that are positioned at different vertical locations with respect to the "horizontal" movements of the carriage that moves the printhead in swaths across the print media. In the case of a black and white printer, each nozzle firing instruction can be represented by a single bit is of a binary signal (i.e., either Logic 1 or a Logic 0), and a slice that defines a single set of 104 nozzle firing instructions can be represented by seven (7) different 16-bit words.

When using slices containing seven (7) different words per slice, the present invention utilizes a single "control bit" of a "control word" to represent each of the data words of the slice. Depending upon which type of compression technique is used, the control bit for each data word will be set to either Logic 1 or Logic 0, depending upon the value of the data word (i.e., representing pels of print data within the slice) as compared to a pre-determined data word value (such as $0000_{16}$) that is chosen by the system, and which may be used in both types of data compression techniques. After each slice has been analyzed by both types of data compression techniques, certain of the data words in the slice can be temporarily discarded, leaving behind less than seven (7) data words to represent that slice as compressed data. This compressed data for each individual slice will be matched up with a "control word" that is made up of the individual control bits described above, thereby creating a relatively small data set can be stored in memory in a space that would be less than the amount of memory required to store the uncompressed slices for the same print data. Later, these (compressed) data sets (one per individual slice) can be decompressed according to the proper decompression technique, and the full print data is then restored just before printing by the printhead. As part of the control word, a "mode bit" can be set to either binary value of Logic 1 or Logic 0, thereby indicating which of the two data compression techniques was initially used for that slice.

In the preferred embodiment, the compression procedure takes place at a host computer at which the original print job data file originates. Instead of transmitting serially or in parallel to a printer the entire uncompressed bitmap for the print job, this host computer will be able to send compressed data, which will not only take less space for temporary storage in the memory of both the host computer and the printer that receives this print job, but also will take less time to be transmitted over the data link, which could be a network. Once this compressed data file is received at the printer, it will be temporarily stored until needed by the printhead so that the final output print media can be created by the printer. When it is time to create an image table bitmap so that the printhead can be supplied with its necessary data, each slice will be decompressed according to the appropriate compression/decompression technique, the original bitmap data will be generated to make up the individual swaths, and the individual swaths will be combined into an entire printed page, as needed by the printhead.

In the preferred embodiment, the two data compression techniques used are called a "USE-X MODE" and a "REPEAT MODE." In either mode, an initial value for a "target word," which is given the variable name "X," must be chosen. This data value will typically be zero ($0000_{16}$) since most printed pages have far more blank area than printed area. This may not be true, of course, when the printed image turns out to be a Gray scale image of some type of photograph or other artwork, particularly where contones (i.e., continuous tones) of Gray scale imaging are used.

Assuming the target word value is equal to zero ($0000_{16}$), in the USE-X mode, for any data word of the slice that also has a value of zero ($0000_{16}$), the control bit will be set to Logic 1, and that word can be eliminated from the information stored as compressed data. Later, when decompression takes place, for each bit of the control word that is set to Logic 1, an entire data word of sixteen bits set to Logic 0 (i.e., $0000_{16}$) will be inserted at the correct location within the individual slice being generated for the printhead.

In the REPEAT mode compression technique, the value for the variable X is only significant for testing the first word of an individual slice. In general, the control bit value for each data word of a slice using the REPEAT mode will be set to Logic 1 only if this data word's hexadecimal value is equal to the previous data word's hexadecimal value. However, the very first word of each slice has no previous word to be compared to, so it is compared to the target word, having the hexadecimal value equal to the variable X. If, for example, the target word is set to a value of zero ($0000_{16}$), then the control bit for the first data word of each slice will be set to Logic 1 only if the data value of the first word in that slice is also equal to hexadecimal zero ($0000_{16}$).

Naturally, the entire compression/decompression technique could be accomplished within the host computer alone, or within the printer alone, although the preferred mode of operation is to have the compression take place in the host computer while the decompression takes place within the printer.

Still other objects of the present invention will become apparent to those skilled in this art from the following description and drawings wherein there is described and shown a preferred embodiment of this invention in one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description and claims serve to explain the principles of the invention. In the drawings:

DETAILED DESCRIPTION OF THE PREFERRED EMBODIMENT

Reference will now be made in detail to the present preferred embodiment of the invention, an example of which is illustrated in the accompanying drawings, wherein like numerals indicate the same elements throughout the views.

Figure 1:
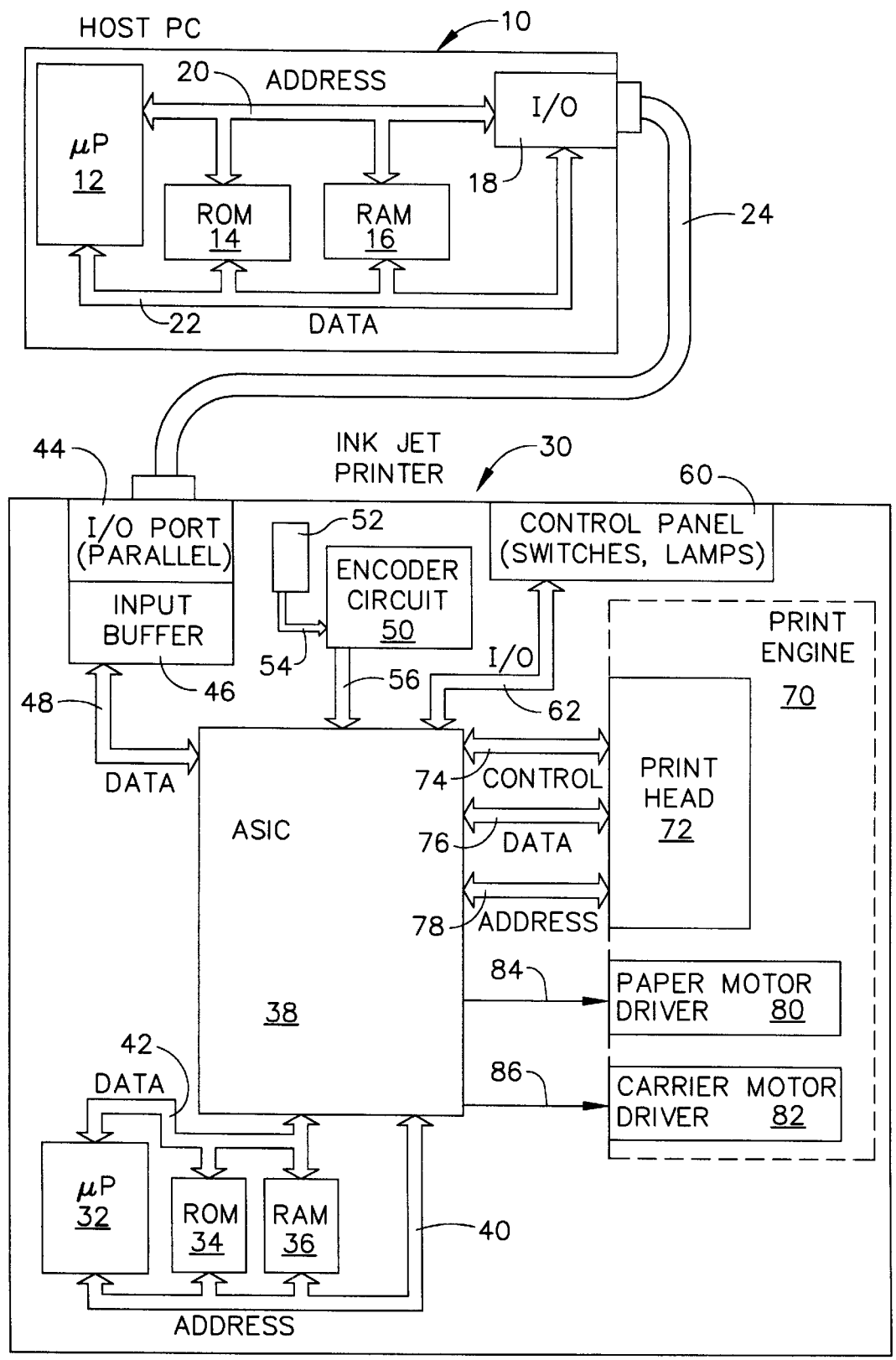
FIG. 1 is a block diagram of a printing system that contains a host computer and an ink jet printer that are configured for use according to the principles of the bitmap print data compacting method of the present invention.

Referring now to the drawings, FIG. 1 shows a printing system that includes a host computer or host PC 10 being connected to an ink jet printer 30 via a communications cable 24. Host computer 10 will typically contain a microprocessor 12, read only memory (ROM) 14, random access memory (RAM) 16, and some type of input/output port 18. These various essential structural elements are connected together by an address bus 20 and a data bus 22. In many applications, the host computer will contain some type of word processing program that creates data files to be printed, and these data files can be transferred to printer 30 in either a high level language (HLL) format such as a PostScript format or a different high level language such as PCL, or the data can be transferred in a "bitmap" format which can be directly operated upon by the printer 30. Alternatively, the host computer 10 could be a network server that contains a large non-volatile data storage device such as a hard disk drive (not shown) which can accept data files from other computers in a network system (such as a local area network (LAN)), or can itself create data files (e.g., using a word processor program) to be temporarily stored on the hard disk drive, and then such data files can be transferred to the printer 30 as needed.

Ink jet printer 30 also comprises a microprocessor 32, ROM 34, RAM 36, along with an address bus 40 and a data bus 42. Printer 30 also includes a special function ASIC (application specific integrated circuit) 38 which is integral to the handling of the print data as it received from the host computer and until it is printed. The communications link 24 is connected to an input/output port 44, which preferably comprises a parallel communications port having a bidirectional capability. I/O port 44 is then connected to an input buffer 46, which is further connected to a data bus 48 that communicates the incoming print data from input buffer 46 to ASIC 38.

The handling of the print data by ASIC 38 is ultimately controlled by a computer program operating on microprocessor 32. On some printers, the incoming print job data is of a high level language (such as PCL) and must undergo a raster image processing (RIP) step before being further transferred to the print engine. In such situations, microprocessor 32 will control the RIP and will temporarily store the high level language print job data in a portion of RAM 36, while also storing the by-product created by the RIP in a bitmap format, also in another portion of RAM 36. This bitmap data will eventually be transferred through ASIC 38 to the print engine. If the print job data arrives in a bitmap format from host computer 10, then it may be possible for the print data to directly be transferred from input buffer 46 through ASIC 38 to the print engine 70, assuming that all of the components of printer 30 are prepared for that data transfer to occur at a given moment. Under normal circumstances, the print engine cannot keep up with the transferred data incoming at I/O port 44, and this data must, therefore, be sent via ASIC 38 into RAM 36 for temporary storage until the print engine is ready to accept more data.

On FIG. 1, the print engine is diagrammatically designated by the index numeral 70 and includes a printhead 72, a paper motor driver circuit 80 and a carrier motor driver circuit 82. These major components of print engine 70 are controlled by ASIC 38 via various electrical signals, transferred in the case of printhead 72 by a control bus 74, data bus 76, and address bus 78. In a preferred ink jet printer 30, printhead 72 would actually comprise two separate columns of ink-emitting nozzles (and therefore, is essentially equivalent to two separate printheads mounted on a common carrier), and control bus 74 would therefore include two sets of heater lines and two separate chip enable lines, as well as a common set of power supply lines. Preferably, the paper motor driver 80 is a stepper motor drive and carrier motor driver 82 is a DC motor drive. Drivers 80 and 82 are controlled by signal lines 84 and 86, respectively, which are further signals that are derived from ASIC 38.

Printer 30 preferably also contains a "control panel," designated by the index numeral 60. Control panel 60 generally represents the various switches and lamps that are accessible by a user at the front panel of printer 30. The switches and lamps are communicated to or from ASIC 38 by a set of I/O lines 62.

The physical location of the carrier (not shown) that moves the printhead of printer 30 in the horizontal direction is detected by an encoder, diagrammatically designated by the index numeral 52 on FIG. 1. Encoder 52 creates quadrature signals that are transmitted by wires 54 to an encoder circuit 50. The encoder circuit conditions these quadrature signals and further transmits them along conductors 56 to ASIC 38, and through these signals the precise position of the printhead is known at all times within one part of 300 or one part of 600 of an inch, depending upon the resolution of printer 30 in the horizontal direction. This information is not only used in controlling the carrier motor drive 82, but also in controlling the on and off actuations of the ink nozzles in printhead 72.

In a preferred printer, such as a Lexmark™7000 Color Jetprinter™ manufactured by Lexmark International, Inc. located in Lexington, Ky., the print job information arriving from the host computer will already be in a bitmap format. The original data file, whether it is a word processing character file or some type of graphical data file in PostScript or PCL, will be RIPed in the host computer by a special "driver" program used with the particular type of printer, and the resulting bitmap will be output at I/O port 18 and then communicated through the communications channel 24 into the corresponding I/O port 44 on printer 30. As related above, in conventional printers this bitmap information may well comprise a large rectangular array of pels that are essentially as large as the entire sheet of paper for which a representation of the print job is to be imparted. Generally speaking, the print job data is transferred from input buffer 46 through ASIC 38 into RAM 36 for temporary storage. At times when printhead 72 is in the correct position, the "firing logic" of ASIC 38 will be turned on so that ink dots will be emitted by the nozzles of printhead 72 onto the paper or other print media upon which the image representation is to be placed. When the ASIC 38 is turned on, it "grabs" print data by DMA (direct memory access) from RAM 36 using information stored in another table of RAM 36 that provides ASIC 38 with the memory address of the beginning address in RAM 36 containing the print data, and also the "print start position" (i.e., the slice location) for the current swath that is about to be printed by printhead 72. ASIC 38 compares the print start position to the present carrier position, which is the actual present position of printhead 72, as provided by encoder circuit 50. Once this comparison becomes true (see more detail below), then the print engine 70 will begin the process of causing ink to flow through the print nozzles of printhead 72 onto the paper or other print medium.

At times when the printhead 72 is turned off, i.e., when no pels are to be placed on the print medium, then it is preferred that the firing logic in ASIC 38 be shut down until needed for the next print operation. This is described in greater detail hereinbelow.

Figure 2:
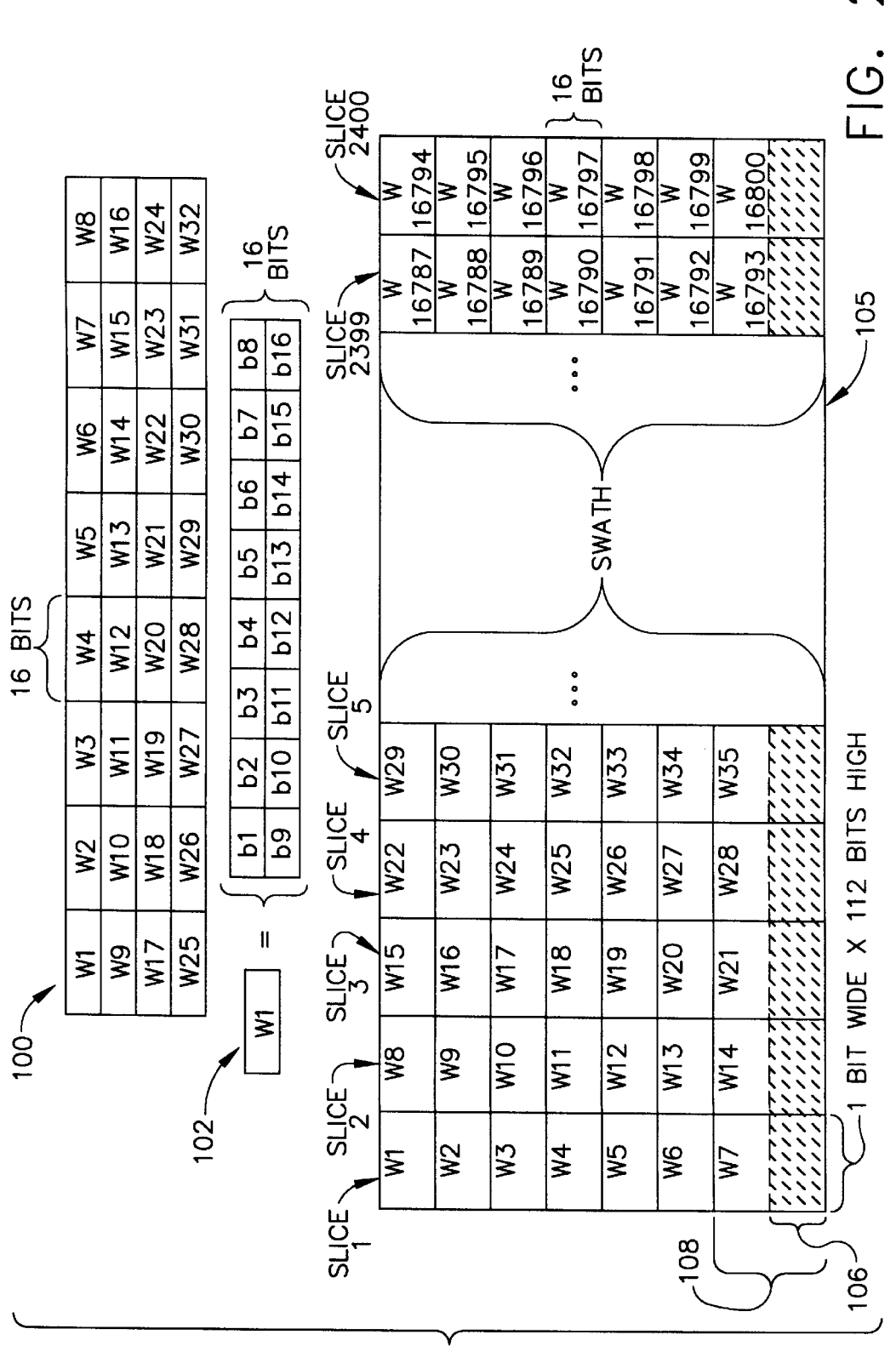
FIG. 2 is a diagrammatic view of print data as it is stored in memory and as it is rotated to create a swath of bitmap data to be printed by a nozzle array in an ink jet printer constructed according to the principles of the present invention.

In FIG. 2, index numeral 100 designates a graphical representation of memory elements that could be found in either RAM 16 of host computer 10 or RAM 36 of printer 30. Each of the rectangles in "block" 100 represents a data word, which in turn represents sixteen (16) bits of binary information. As seen in the diagrammatic block 102 on FIG. 2, the first word designated "W1" represents 16 bits, designated "b1" through "b16."

It is typical to represent memory locations and binary information that is being stored in memory locations in a manner similar to that shown on portions of FIG. 2 at numerals 100 and 102. In other words, if a series of binary data presents itself to a communications port or to some type of memory device such as a RAM chip, hard disk drive, address bus, or data bus, then it is typical to represent this information as a series of either binary or hexadecimal numbers that are typically grouped in either bytes or words. These bytes or words are typically then grouped horizontally across a printed page (when viewing such information on a printout or a monitor screen) until the binary or hexadecimal numbers come to the end of a line on that page, after which any further binary or hexadecimal data is moved down to the next line, beginning along the left-hand border and continuing toward the right border. However, when using such binary or hexadecimal data with ink jet printers, or other printers using some type of array of light emitting diodes or other transducing devices that will ultimately create a dot on some type of print media, the print job information is typically rotated 90° (known as a "delta rotation") so that the consecutive data stream that is to be stored in memory represents vertical information rather then some type of horizontal representation of the image to be printed. In other words, the consecutive binary information as seen in the top row of the binary data shown at index numeral 100 becomes rotated to become "SLICE 1" of the swath 105, depicted at the bottom of FIG. 2.

In an exemplary example using a printhead that contains 104 vertical nozzles that are spaced apart by 1/300 inch (thereby providing a 300 dpi resolution), a swath of data would require at least 104 binary bits of data to define all the pels of an entire single slice for that swath. When using data words of 16 bit size each, each slice would require 6.5 such data words, which would produce 16×6.5=104 data bits to represent the same 104 pels for that particular slice. For SLICE 1, these words are represented by the symbols W1, W2, W3, W4, W5, W6, and W7.

Since most modem microprocessors have registers that are at least sixteen (16) bits wide, it is easier to write a computer program that uses entire 16-bit wide data words rather than only portions of words, and therefore, it is preferred to use seven (7) entire words to represent SLICE 1 than to attempt to "save" the last eight bits of the seventh word W7 for some other data storage purpose. Therefore, the seventh data word, designated by index numeral 108, will be used in its entirety to represent a portion of SLICE 1, and its last eight bits designated by the index numeral 106, will essentially be wasted space in memory, insofar as representing any type of bitmap print data. Of course, the computer programmer could potentially arrange to use the last eight (8) bits of the seventh data word for each of the slices for some other purpose, such as error checking, but that would increase the complexity of the computer program as well as slow down the processing speed of printer 30, mostly by requiring microprocessor 32 and ASIC 38 to perform other operations using these eight data bits at times when these components would be better used to quickly and efficiently transfer data to the print engine 70 during times when printhead 72 has been activated.

As can be seen on FIG. 2, SLICE 2 comprises seven (7) additional data words, designated W8–W14, in which the last eight (8) data bits of W14 are not used to contain any pel binary data to be used in the final printed rendition of this print job. Each additional slice also contains the same type of format of seven data words. Swath 105 represents an eight-inch wide representation (at 300 dpi in the horizontal direction), and therefore, contains 2400 slices. As can be seen on FIG. 2, slice 2400 contains seven data words, designated W16794–W16800. As before, each of these data words contains 16 bits, in this case representing 16 vertical nozzle positions on the printhead, and the last word W16800 only uses its first eight bits of information (i.e., to control the last is eight (8) nozzles) to help create the printed representation of this swath 105.

Figure 3:
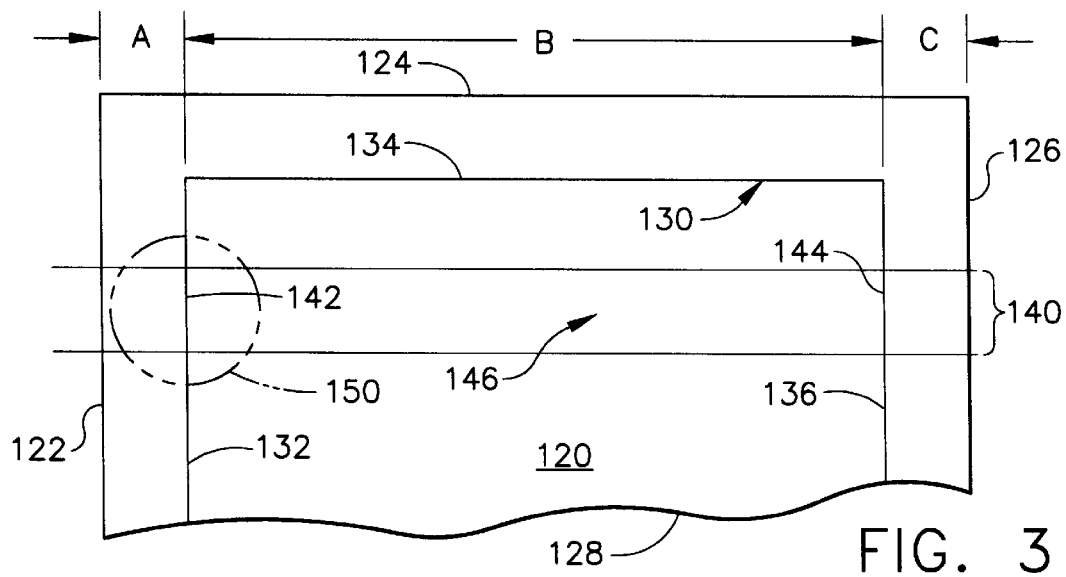
FIG. 3 is a front view of a portion of a printed page showing a swath of print data on that printed page, and described using the principles of the present invention.

In FIG. 3, a portion of a printed page is designated by the index numeral 120. To illustrate an important aspect of the present invention, it will be assumed that a single pel-width line is to be printed on page 120, and this single pel-width line, designated by the index numeral 130, is to contain three separate segments, a vertical segment 132, a horizontal segment 134, and another vertical segment 136. For the purposes of this illustration, it will be assumed that segment 134 is eight inches long, and is equivalent to dimension "B" as shown on FIG. 3. Page 120 is to be 8.5 inches wide, and therefore, dimension "A" is equal to 0.25 inches, and dimension "C" is similarly equal to 0.25 inches. The left-most edge of page 120 is designated by index numeral 122, the right-most edge by index numeral 126, the top-most edge by index numeral 124, and the cut-off edge by index numeral 128.

Figure 4:
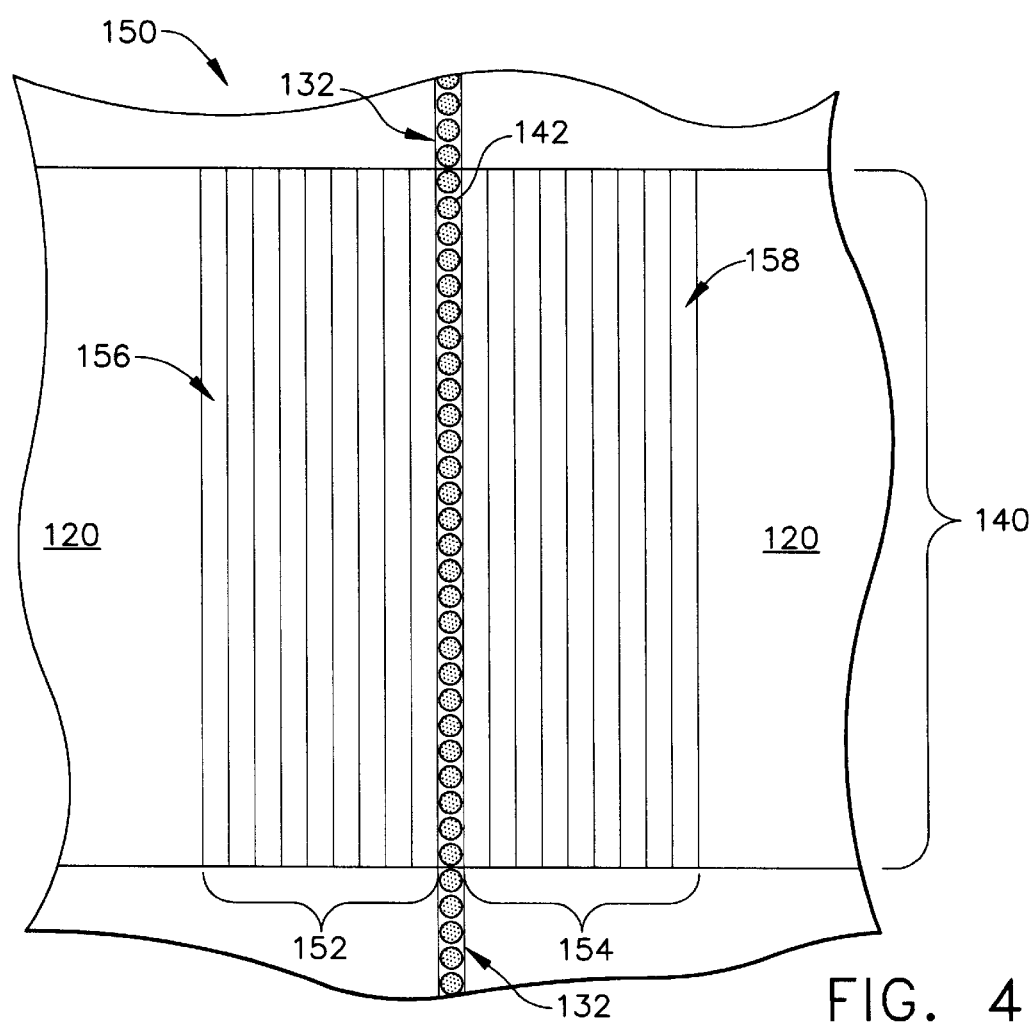
FIG. 4 is magnified front view of a portion of the printed page of FIG. 3.

The horizontal space between two parallel horizontal lines, designated by index numeral 140, designates a swath of print data that has been imparted onto page 120. In the above example, swath 140 will be approximately 1/3 inch in width (or height), using a printhead having an array of 104 nozzles at 300 dpi resolution. As can be seen in FIG. 3, swath 140 only needs to print at two (2) slice locations across the entire page 120, i.e., at slice location 142 and slice location 144. The details at the left-hand slice 142 are presented in a magnified view as seen in FIG. 4 at the circle 150. In FIG. 4, it can be seen that line segment 132 represents a single slice-width line of printed pels that run vertically across page 120. The line segment 142 represents the slice of pels that are contained within swath 140, and this line segment 142 is a sub-set of line segment 132. It will be understood that all 104 pels of this slice are not individually depicted on FIG. 4, to clarify this illustration.

In many conventional ink jet printers the entire swath 140 would not be RIPed into an 8.5 inch wide set of slices to form the image seen on FIG. 3. Instead, the left-most slice (i.e., slice 142) and the right-most slice (i.e., slice 144) would be determined, and all of the area of the page within swath 140 to the left of the left-most slice 142 would be ignored, and all of the area of the page within swath 140 to the right of the right-most slice 144 also would be ignored.

Typical printheads include at least two columns of substantially vertically arranged nozzles, wherein nozzles from both columns contribute to the printing of swath 140, which includes slice 142. To print a substantially vertical row of pels at slice 142, printhead 72 needs to physically move a short horizontal distance so that each of its nozzles has a chance to travel over the horizontal location represented on the paper at slice 142. To do so, "padding" is added both to the left and to the right of slice 142 so that the movements of printhead 72 can be controlled throughout all of its necessary horizontal positions to enable each of the nozzles to print at the proper vertical location along slice 142.

Using current technology, it is preferred that this padding have a minimum size of twenty (20) slices, and these are represented by the slices 152 to the left of slice 142, and slices 154 to the right of slice 142. As seen in FIG. 4, the left-most padding slice is designated by the index numeral 156, and the right-most slice is designated by the index numeral 158. Of course, it will be understood that no printed pels are laid down within any of the padding slices 152 or 154, and that the slices are merely defined to enable a high resolution nozzle array to successfully print all of the necessary dots to create a printed slice 142 while going through a small horizontal translation to enable each of the necessary nozzles to achieve its correct location at the time of spraying ink upon page 120.

By using the compression methods described hereinbelow, a very large number of "blank" slices can be eliminated from the compressed data set for swath 146. Namely, since all of the slices between the left-most slice 142 and the right-most slice 144 are to be completely non-printed blanks, there is no good reason that all of this "blank" data in the form of pels having a value of Logic 0 should be part of the temporary image table built in the printer's memory until the printhead is ready to print this particular swath. Both of the disclosed compression techniques herein can eliminate a very large majority of the data words within each of these blank slices, as will be seen below.

Figure 5:
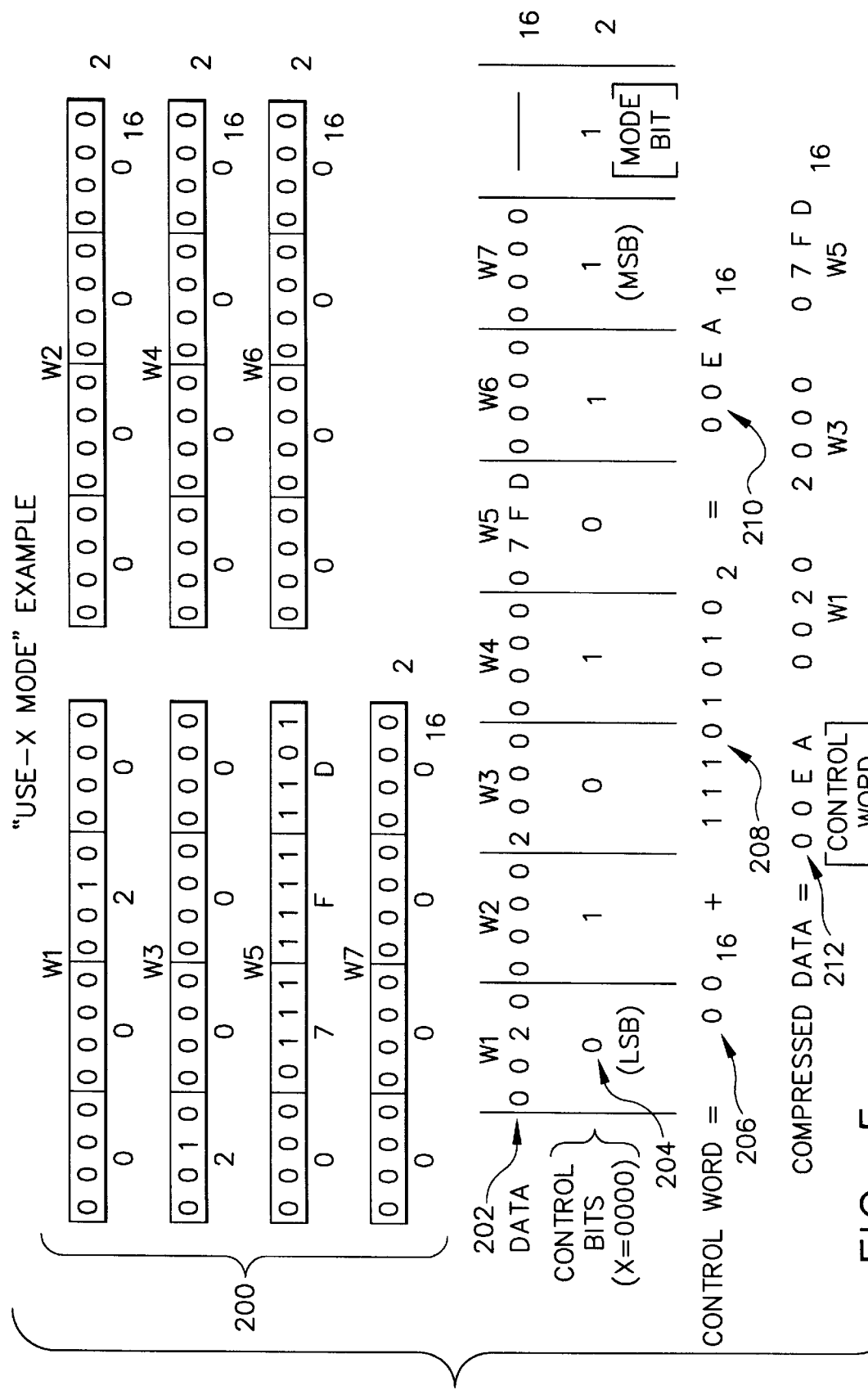
FIG. 5 depicts an example of the USE-X mode, showing both the uncompressed data and the compressed data, as that data is manipulated by the compression method of the present invention, and while also showing the control word data.

FIG. 5 provides an example of a compression technique designated as a "USE-X mode" compression, starting with a set of data at the reference numeral 200 that represents the binary pels of a single slice for an ink jet printer having a printhead with 104 nozzles. This slice consists of seven (7) data words, designated "W1"–"W7." The data set 200 shows the seven (7) data words in both binary and hexadecimal values. Of course, the last eight (8) bits of the word W7 are not used, since we really only need six and one-half 16-bit words to describe 104 pels. In the example on FIG. 5, the data word value in hexadecimal is as follows:

0020 0000 2000 0000 07FD 0000 0000, which is seen at the reference numeral 202. In the present invention, a "control" word is formed by analyzing each of the data words W1–W7, and assigning a "control bit" for each of these data words. In addition, it is desirable to find the most frequently occurring word, designated by a variable named "X" which, for ink jet printers, is typically a white space, represented by the hexadecimal value $0000_{16}$.

In the USE-X mode each bit "i" of the control word is either set to Logic 1 if the word at the same position i of the slice is equal to the value chosen for X, or is cleared to Logic 0 to indicate that the word i is not equal to the value for X, in which case the value of this next word i should be placed into the compressed data. The individual bits of the control word in this example are depicted at the reference numeral 204, and since the value of X equals $0000_{16}$, the control bits for the words W2, W4, W6, and W7, are set to Logic 1, and the control bits for the words W1, W3, and W5, are cleared to Logic 0. The eighth bit of the control word is the "mode bit," and is used to designate which of the modes of compression are used for this data slice. In the preferred embodiment, the mode bit in FIG. 5 is set to Logic 1 to indicate that the USE-X mode compression technique was used for this slice. In the control word representation at reference numeral 204, the mode bit, therefore, is set to Logic 1.

As seen on FIG. 5, the control bit representing the word W1 becomes the least significant bit (LSB) in the control word, and the bit representing the data word W7 becomes the most significant bit (MSB) for the control word (other than the mode bit). Therefore, the control word in this example has the following value, as seen at the reference numerals 206, 208, and 210: $00EA_{16}$. The first two digits of the control word in hexadecimal are depicted at the reference numeral 206, and since there are only eight bits of the control word defined by the data slice containing the words W1–W7 (including the mode bit), the first two digits of the control word 210 are set to $00_{16}$. If the slice were to contain more than 112 pels, then the two most significant digits of the control word would contain actual data, rather than always being set to zero. The two least significant digits of the control word are set to the values shown at the reference numeral 208, which are the same data for the control word 204 (seen in its binary form); however, the order of the bits has been reversed at the reference numeral 208 as compared to the data at reference numeral 204. When combining the two most significant digits at 206 and the two least significant hexadecimal digits at 208, the final control word is the result at numeral 210.

The compressed data for this example slice is depicted at the reference numeral 212. It begins with the control word, having a value of $00EA_{16}$, and then is followed by the data words W1, W3, and W5, which had data values that were not equal to the value for X. Using this compression technique, it can be seen that the original seven (7) data words have been compressed to four (4) words, one of which is the control word.

Figure 6:
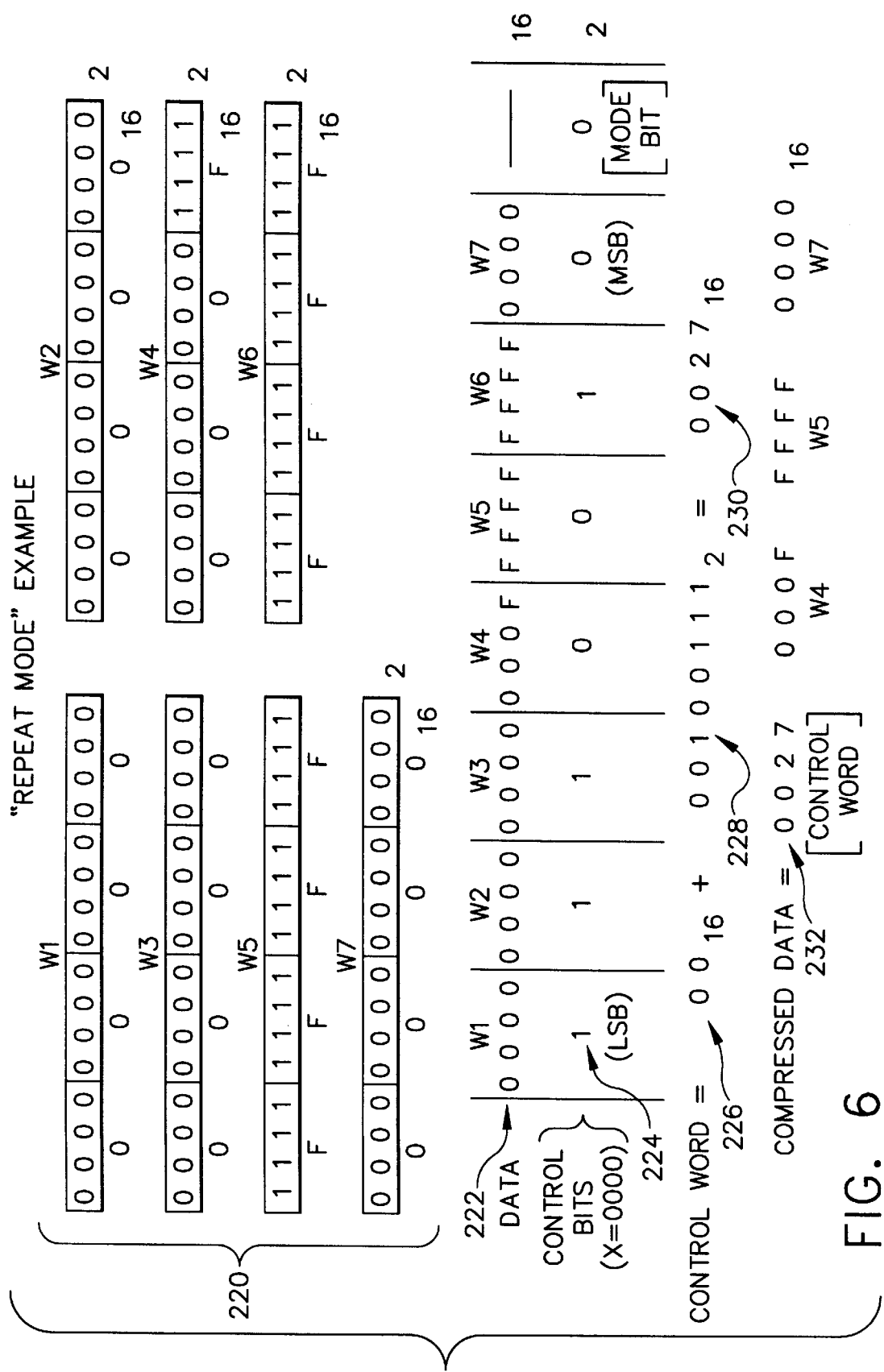
FIG. 6 depicts an example of the REPEAT mode, showing both the uncompressed data and the compressed data, as that data is manipulated by the compression method of the present invention, and while also showing the control word data.

In FIG. 6, another example is provided using a different compression technique known as a "REPEAT mode." The data word values in both binary and hexadecimal for a single slice are depicted at the reference numeral 220, for the data words W1–W7. The data for this slice is also listed in hexadecimal at the reference numeral 222, and contains the following value:

0000 0000 0000 000F FFFF FFFF 0000.

On FIG. 6, the corresponding control bits that make up the control word representing each of the words W1–W7 of the slice are depicted at the reference numeral 224. In the REPEAT mode, each bit "i" of the control word is set to Logic 1 to indicate that the word at the same position i of the slice is the same as the word at the previous position (i–1). In addition, the least significant control bit i is set to Logic 1 if the data value of the first word W1 is equal to the value of "X." In the example depicted on FIG. 6, X is set equal to $0000_{16}$, although any value for X could be chosen.

The control word bits at 224 are set to Logic 1 for the words W1, W2, W3, and W6. For word W1, its value of $0000_{16}$ is equal to the value for X, and so its control bit (which is the least significant bit) is set to Logic 1. Since the value for W2 is equal to that of W1, its control bit is set to Logic 1. Similarly, the control bit for the word W3 is set to Logic 1 since its value is equal to that of the word W2. Finally, the value for W6, $FFFF_{16}$, is equal to the value of the word W5, and so the control bit for word W6 also is set to Logic 1.

Since the value for the word W4 is not equal for the word W3, its control bit is cleared to Logic 0, and for similar reasons, the control bits for the words W5 and W7 are also cleared to Logic 0. In the preferred embodiment, the mode bit is cleared to Logic 0 when the REPEAT mode compression is used, and this is depicted at the control bit 224 on FIG. 6.

The result is a control word having the value $0027_{16}$, as shown at the reference numeral 230. This control word comprises two most significant digits set to $00_{16}$, as seen at the reference numeral 226, which in this case indicate that there were only seven data words in the original slice of print data. Of course, if the data slice included more than 112 pels of information, then the two most significant digits of the control word would potentially have non-zero values. The two least significant digits in hexadecimal of the control word are shown in binary format at the reference numeral 228. As can be seen on FIG. 6, these digits in base 2 are in the reverse order of the control bits depicted at the reference numeral 224. The result is the control word at reference numeral 230 having the value 0027, in hexadecimal. If the data value for word W1 had not been equal to the value for X then the least significant bit (LSB) for the control word at reference numeral 224 would have been cleared to Logic 0.

The final result is the compressed data as shown at the reference numeral 232. The compressed data begins with the control word, $0027_{16}$, and is followed by the data values of the words W4, W5, and W7, as shown at the bottom of FIG. 6. In this example, the initial seven (7) data words for slice 220 have been compressed down to four (4) words, including the control word.

Figure 7:
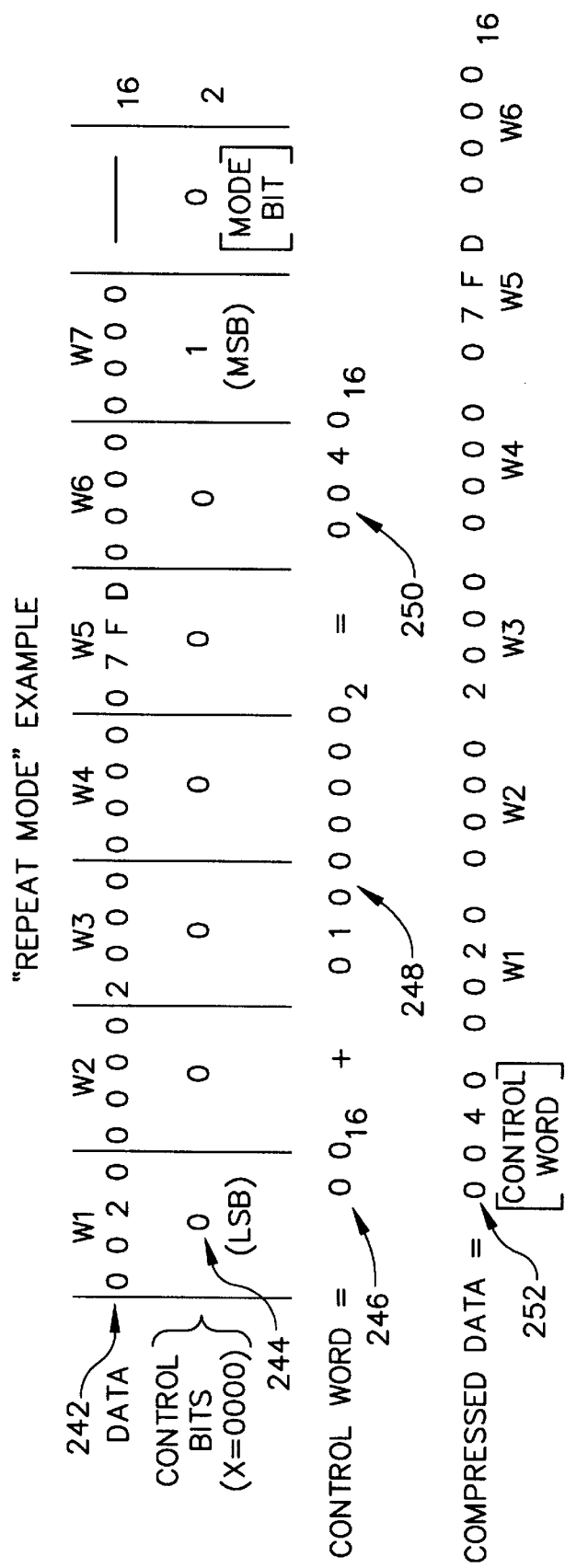
FIG. 7 is another example of the REPEAT mode, using as original data the slice depicted in FIG. 5 (where it underwent a USE-X mode compression/decompression methodology).

In FIG. 7, the data that was used in the example on FIG. 5 is compressed using the REPEAT mode compression technique. The original slice data is shown at the reference numeral 242 for the words W1–W7. The associated control bits are shown at the reference numeral 244, in which the mode bit is cleared to Logic 0 since we are using the REPEAT mode. As can be seen in this example, there was very little repeating, and only the most significant bit (MSB) was set to Logic 1, since the value in the word W7 was equal to the value of the word W6.

The resulting control word is a combination of its two most significant digits cleared to zero, at reference numeral 246, and the control bits 248, giving a final control word value of $0040_{16}$, at reference numeral 250. The compressed data, at the reference numeral 252, is seven words long (including the control word), so it can be seen that the REPEAT mode compression technique was not useful in reducing the number of words to be stored in memory as compared to the original raw data of the slice in its original bitmap full pels format.

Figure 8:
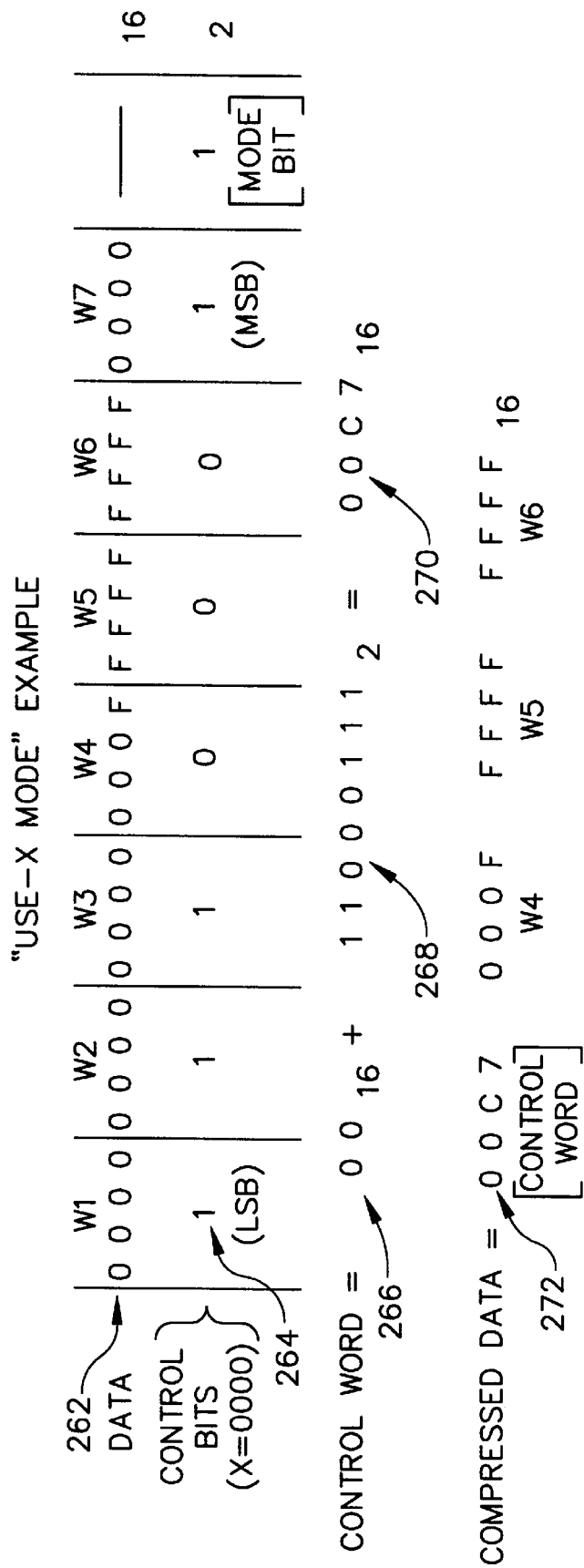
FIG. 8 is another example of the USE-X mode, using as original data the slice depicted in FIG. 6 (where it underwent a REPEAT mode compression/decompression methodology).

In FIG. 8, the data used in the example of FIG. 6 is compressed using the USE-X mode compression technique. The original pel data in hexadecimal is shown at the reference numeral 262, and its corresponding control bits are shown at the reference numeral 264. The mode bit is set to Logic 1, since the USE-X mode is being used. The control word is made up of the first two most significant digits of a zero value, at reference numeral 266, in addition to the word 268 comprising the control bits. The result is the control word at reference numeral 270 having a value 00C7, in hexadecimal. The compressed data, at reference numeral 272, is only four (4) words long, including the control word. This is a substantial compression, and this data in fact compressed to the same number of words as when using the original REPEAT mode compression technique depicted in FIG. 6. For this particular slice of pel data, both compression techniques can be used with equal compression ratio results.

Figure 9:
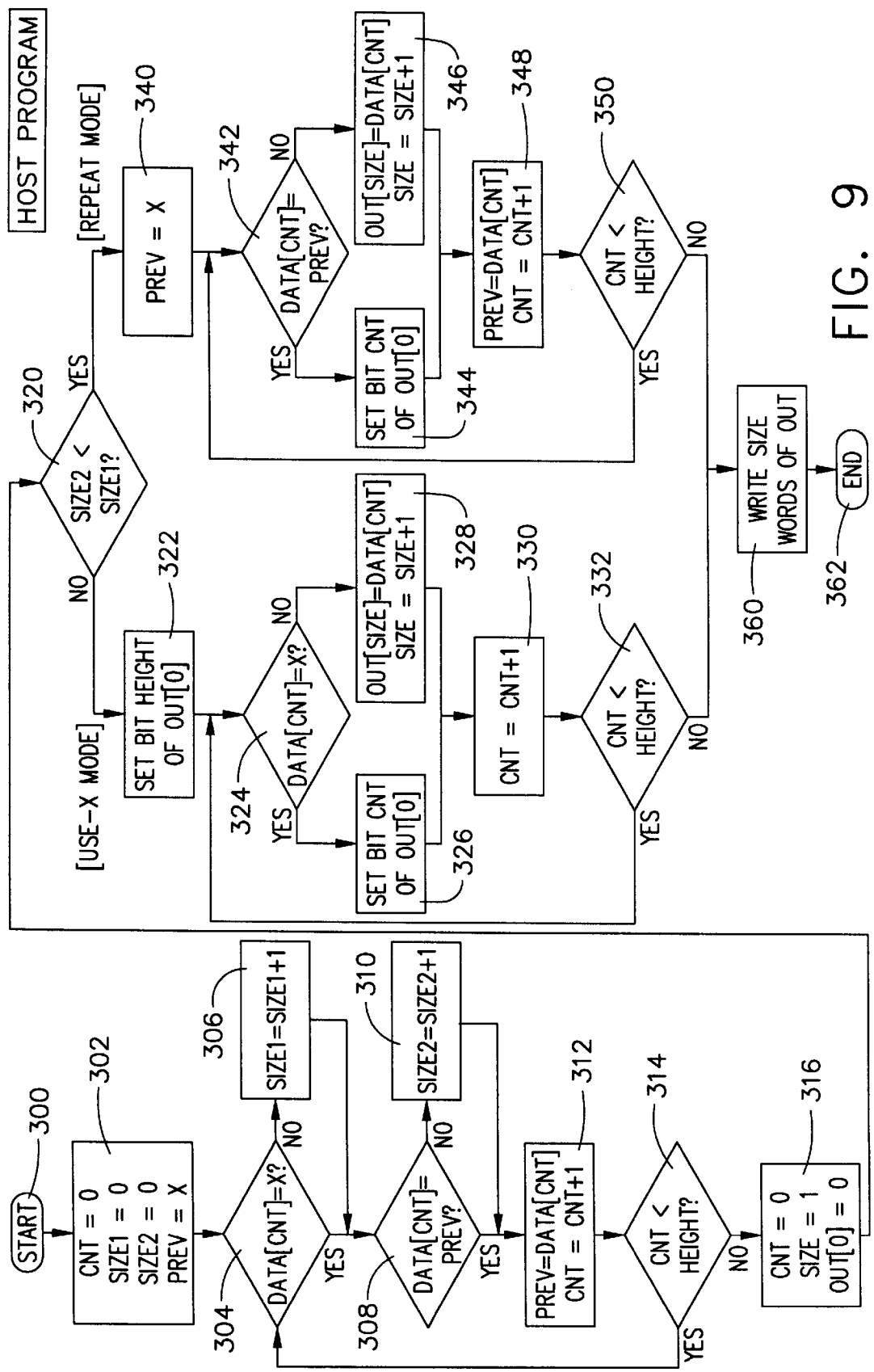
FIG. 9 is a flow chart of the functions required to perform the compression steps according to the principles of the present invention, which in the illustrated embodiment, are performed in a host computer.
Figure 10:
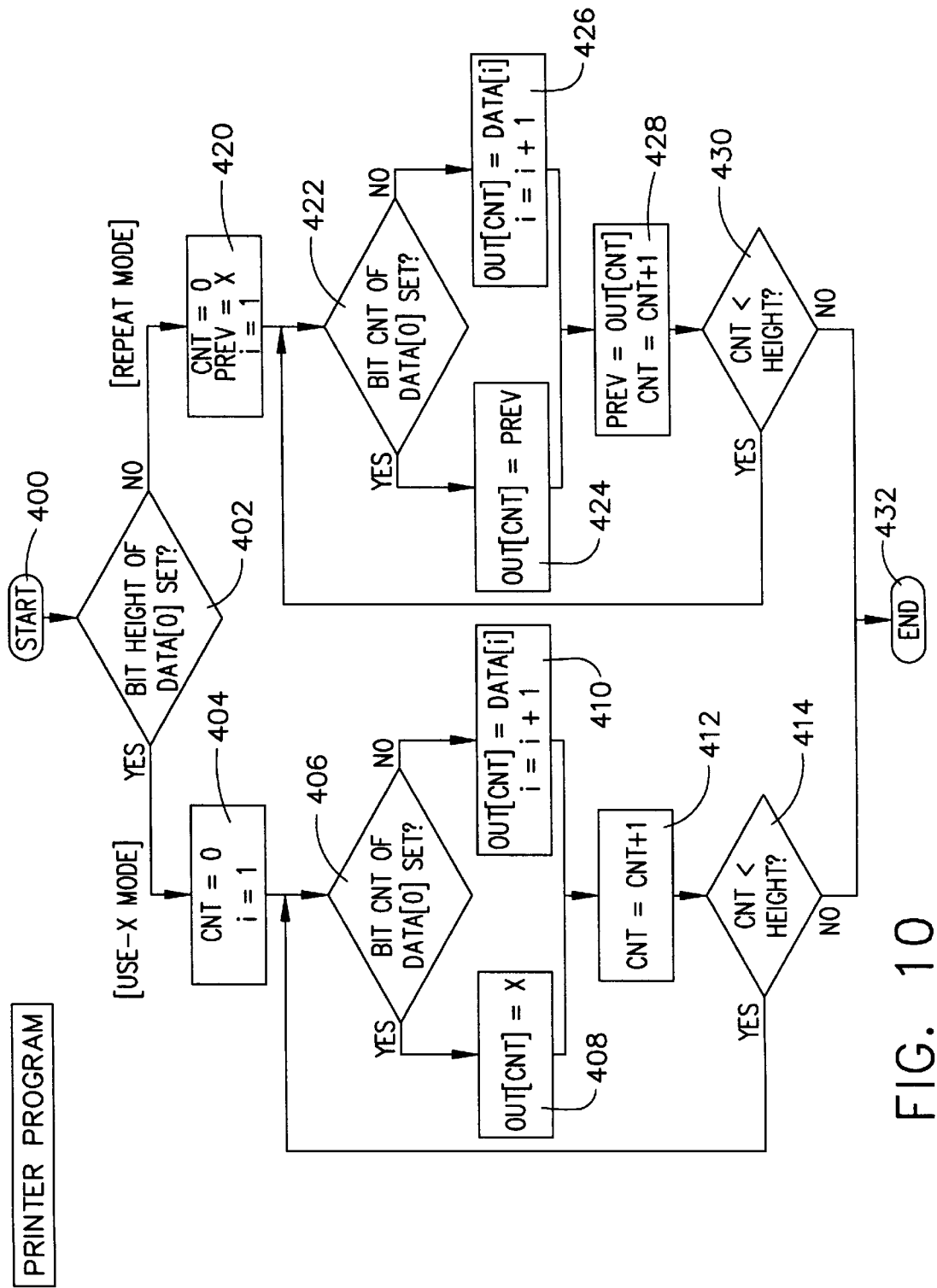
FIG. 10 is a flow chart of the functions required to perform the decompression steps according to the principles of the present invention, which in the illustrated embodiment, are performed in the printer itself.

The flow charts showing the logical steps required in performing the compression and decompression techniques according to the principles of the present invention are provided on FIGS. 9 and 10. In compressing actual bitmap slice data, each slice will be compressed by both compression techniques, then a comparison is made to see which technique results in the fewest words that would need to be stored in memory after compression takes place. It will be understood that other types of compression techniques could be used in this invention without departing from the principles of the present invention. It would even be possible to use more than two compression techniques on each of the data slices, however, the mode bit would have to be expanded to more than a single bit if more than two compression techniques were being used to determine the best technique for each slice of data.

FIG. 9 depicts the important logical sets required to compress the data of a single slice of bitmap print data, and includes both data compression techniques described above. Beginning at a "Start" block designated by the reference numeral 300, the logic flow travels to a function block 302 that initializes several variables used during the compression procedure. A loop counter used to control the number of words per slice is set to zero (0), and this is given the variable name "cnt." Two variables are initialized to zero (0) that keep track of the size of the compressed data for the two modes being used (i.e., the two different data compression techniques). For the USE-X mode the variable name is "size1," and for the REPEAT mode the variable name is "size2." Another variable named "prev" is set equal to the value of "X", and ideally, X represents the most common data word previously found in print data. Generally speaking, the most common data word is equal to zero ($0000_{16}$), since the most common slice to be printed for most documents is a "blank" slice.

The logic flow now travels to a decision block 304, where the next data word to be analyzed is compared to the value of the variable X, using a variable named "data[cnt]." This variable "data[cnt]" represents an uncompressed data word for this is particular slice, and since the variable cnt is presently set to zero (0), this acts as a pointer to the first word position in the slice being analyzed.

If the answer at decision block 304 was NO, the logic flow travels to a function block 306 that increments the value for the variable size1, which increases the number of words required in the compressed data for the USE-X mode. The logic flow now travels to another decision block 308, regardless of whether the flow originated from the YES result of decision block 304 or from the output of function block 306.

At decision block 308, the present data word in the slice is analyzed to see if it is equal to the value of the variable prev, which essentially asks if the data of the "new" or current data word is the same as the data in the previous data word. As in decision block 304, the variable data[cnt] represents the first data word of the slice being analyzed, since the value of cnt is presently set to zero (0). If the answer at decision block 308 is NO, the logic flow travels to a function block 310 that increments the value of the variable size2. As in the case of function block 306, function block 310 increases the number of words that will be required in the compressed data when using the REPEAT mode.

The logic flow now travels to a function block 312, regardless of whether it comes from the YES result of decision block 308, or the output of function block 310. At function block 312, the variable prev is set equal to the value of the variable of data[cnt], which sets the variable prev to the current uncompressed word value for this slice. At this point in the logic flow, the variable prev will be set to the value of the first word in the slice, since the value for the variable cnt is presently zero (0). After this occurs, function block 312 will increment the value of the variable cnt, which means that for the next set of operations in the loop comprising the decision and function blocks 304, 308, 312, and 314, the next data word of this slice will be analyzed.

The logic flow now arrives at a decision block 314, which determines whether or not the variable cnt is less than the height of the slice. This height represents the number of words in a particular slice, and for the purposes of describing the flow chart of FIG. 9, it will be presumed that there are thirteen (13) words of sixteen (16) bits each in a slice. This will provide a precision of 208 bits or pels per each slice, which is useful in a high density ink jet printhead having 208 individual nozzle positions along the vertical direction.

If the answer at decision block 314 is YES, the logic flow travels back to the decision block 304 where the "new" data word is analyzed to see if it is equal to the value of the variable X. Accordingly, the logic flow will later travel to decision block 308 to see if the new data word is equal to the value of the previous data word, as found in the variable named prev. Depending upon the answers, as before, the variables named size1 and size2 may be incremented, meaning that the size in words of the compressed data may have increased, depending upon the value of the current data word in the slice.

If the answer at decision block 314 is NO the logic flow travels to a function block 316, and the analysis of this particular slice has come to an end. In other words, the flow chart of FIG. 9 describes the analysis of only a single slice, and to analyze the next slice of data, the steps 300–314 should be performed, as described above.

At function block 316, the variable cnt is set to zero (0), which now represents the bit position in the control word and the word position in the uncompressed data for this slice. A variable named "size" is set equal to one (1), which is equal to the current size of the compressed data in words. This essentially represents the minimum size for the compressed data, because there would always be at least a control word in all cases for the compressed data of an individual slice. Another variable named out[0] represents a temporary array to store the compressed data. At this time, function block 316 sets the variable out[0] to a value of zero (0), which represents the position for the control word in this slice.

The logic flow now travels to a decision block 320 which determines whether or not the value of the variable size2 is less than the value of the variable size1. If the answer is YES, the logic flow travels to a function block 340, and the REPEAT mode is the more efficient compression technique for this particular slice, since there are fewer data words in the compressed data for the REPEAT mode than there are for the USE-X mode. If the answer is NO at decision block 320, the logic flow travels to a function block 322 which indicates that the USE-X mode is the more efficient compression technique for this slice. If it turns out that the value for both variables size2 and size1 are equal, then the logic flow will travel to the function block 322, and the USE-X mode will be used to create the compressed data.

When using the USE-X mode, function block 322 sets to Logic 1 the bit height for the variable out[0]. This operation sets the most significant bit (MSB) used in the control word to Logic 1, which is the "mode" bit. At function block 322, the most significant bit (MSB) is set to Logic 1, to indicate that this particular slice was compressed in the USE-X mode. On the flow chart of FIG. 9, this is indicated by setting the bit named "height" of the variable out[0].

The logic flow is now directed to a decision block 324 which determines whether or not the next data word value in the uncompressed slice is equal to the variable X. This is indicated on the flow chart of FIG. 9 as asking whether the variable name data[cnt] is equal to X. If the answer is YES, the logic flow is directed to a function block 326, where the bit "i" that corresponds to the current value of the variable named cnt within the variable name out[0] is set to Logic 1. After this occurs, the logic flow is directed to a function block 330. When this occurs, the value of the corresponding data word "i" within this slice will not be saved in the compressed data, since its value was equal to the value of the variable X.

If the result at decision block 324 was NO, the logic flow is directed to a function block 328 where the new data word is copied into the compressed data. On the flow chart of FIG. 9, this is accomplished by copying the variable named data[cnt] into a variable named out[size]. After this has occurred, the variable named "size" is incremented. The logic flow is now directed to a function block 330.

At function block 330, the variable named "cnt" is incremented, which means that the next bit "i" in the control word will be analyzed during the next loop through the logic blocks 324 through 330. The logic flow now arrives at a decision block 332, which determines whether or not the variable "cnt" is less than the value of "height" . As related above, the slices in this example are thirteen (13) data words in size, and so the variable cnt will successfully increment from zero (0) to twelve (12) while yielding a YES result at this decision block, whereby the logic flow will be directed back to decision block 324. Once the variable "cnt" reaches the value thirteen (13), the decision block 332 result will be NO, and the logic flow will be directed to a function block 360.

If the REPEAT mode has been selected for a particular slice, then function block 340 will load the variable prev with the value of the variable X. As related above, variable prev will contain the data word value of the most previous word, at location (i−1), assuming that the current bit in the control word is now equal to "i." If this is the very first word of a particular slice, then the value of the variable prev (via X) is set to a pre-determined data value, such as zero ($0000_{16}$).

The logic flow now travels to a decision block 342, which determines whether or not the current data word value is equal to the previous data word value. In the flow chart of FIG. 9, this is shown as comparing the variable named data[cnt] to the variable prev. If the answer is YES, the logic flow is directed to a function block 344 that sets the current bit "i" (according to the variable named cnt of the variable out[0]) to a Logic 1. When this occurs, the data value of the current word is not saved in the compressed data, since the current data word had a value equal to the previous data word (noting that this slice is being compressed according to the REPEAT mode). The logic flow now travels to a function block 348.

If the result at decision block 342 was NO the logic flow is directed to a function block 346 that copies the new data word into the compressed data. With regard to the variables shown in the flow chart of FIG. 9, function block 346 performs the identical steps as the function block 328, related above. The logic flow is now directed to a function block 348.

At function block 348, the value of the current word (i.e., "data[cnt]") is loaded into the variable named prev, and then the variable cnt is incremented. This updates the value of the variable prev, so that when the next data word in the slice to be analyzed is compared to this "current" word (which will become the "previous" word momentarily), the correct value will be ready for use in the variable prev.

The logic flow is now directed to a decision block 350, which determines whether or not all of the data words in a particular slice have been analyzed by the logic loop comprising the blocks 342 through 350. This decision block 350 operates in an identical fashion to the previously described decision block 332. If the result is YES, the logic flow is directed back to the decision block 342 to operate upon the next data work in the slice. If the result is NO, the logic flow travels to a function block 360.

Function block 360 writes the compressed data either to memory (as a data file) or to a communications port, such as the parallel port of a host computer that is directly connected to a printer. On the flow chart of FIG. 9, this is described as writing the number of words (which is equivalent to the data value of the variable "size"), that exists in the variable "out," which is the number of words in the compressed data for this slice. Of course, if the original uncompressed slice data included thirteen (13) words, corresponding to 208 bits of bitmap data, it is desirable for the number of data words in the variable out at this stage to be much smaller than thirteen (13). In typical graphical data or text data, this will almost always be accomplished. For contone (i.e., continuous tone) data, used for Gray scale images, this may not always be the case.

Once this has been accomplished, the logic flow is directed to the "end" block 362 of this flow chart. As related above, the flow chart of FIG. 9 preferably is a procedure that occurs on a host computer that also originates the print data file that contains this bitmap information. The modem trend for ink jet printers is to perform the raster image processing (RIP) step within the host computer, and then transmit the entire bitmap, slice-by-slice, to the ink jet printer via either a parallel port, or a serial port (which could be over a network). While the communications speed between host computer and the printer may be sufficiently great so as to not require any data compression to keep up with the speed of the printhead or print engine of the printer, it is nevertheless desirable to compress the size of the data stream being transmitted between the host computer and the printer, not only for timing considerations, but more particularly for memory storage space in both the host computer and the printer. In most printers, the received print job data will be temporarily stored in random access memory (RAM) until the printer is ready to print a particular page of this print job. The smaller the space required in the RAM to hold this data, the more pages or entire print jobs that can be downloaded to the printer by one or more host computers, thereby freeing up host computers to perform other tasks, and also perhaps freeing up a network that would otherwise be tied up attempting to communicate data packets of print data.

FIG. 10 depicts a flow chart showing the important logical steps required to decompress the compressed slice data that was created by the flow chart on FIG. 9. As related above, it is preferred that these logical steps occur within the printer that is going to end up creating a printed output on print media, such as paper. However, it will be understood that the logical steps on the flow charts of both FIGS. 9 and 10 could be accomplished either at the host computer, or within the printer, without departing from the principles of the present invention.

The flow chart begins at a "start" block 400 and the logic flow is directed to a decision block 402 that determines whether or not the "mode" bit in the control word for each slice has been set to Logic 1, or cleared to Logic 0. On the flow chart of FIG. 10, the variable named data[0] represents the control word for an entire single slice. If the result at decision block 402 is YES, then the USE-X mode is indicated and the logic flow travels to a function block 404. If the result at decision block at 402 is NO, then the REPEAT mode is indicated and the logic flow is directed to a function block 420.

At function block 404, the variable named "cnt" is set to zero (0), which indicates the bit positioned "i" of the control word. In addition, the variable i is set equal to 1, which represents the word position of the compressed data. The reason that the values of the cnt and i variables are different is because the first word of the compressed data is the control word, and does not represent actual print data. The logic flow is now directed to a decision block 406.

Decision block 406 determines whether or not the bit having the value "cnt" of the variable data[0] is set to Logic 1. If the answer is YES, the logic flow is directed to a function block 408 which retrieves the value of the variable X, and places it into the uncompressed data for this slice. After that occurs, the logic flow is directed to function block 412.

If the result at decision block at 406 was NO, logic flow is directed to function block 410 which retrieves the data word from the compressed data for this slice, and loads that value into the uncompressed data for this slice, having the variable name out[cnt]. After that occurs, the variable i is incremented, so that the next word position in the compressed data will be used, when appropriate. The logic flow travels to a function block 412.

At function block 412 the variable cnt is incremented, so that during the next loop through the logic blocks 406 through 412 the next bit position of the control word will be inspected. The logic flow now travels to a decision block 414. At decision block 414, it is determined whether or not the end of the slice has been reached, by comparing the value of the variable cnt to the height of the slice. If cnt is less than the height (e.g., thirteen words), then the logic flow is directed back to decision block 406. If the result of this comparison is NO, then the logic flow travels to the "end" block 432.

At function block 420, two variables are set to constants, namely the variable cnt is set to zero (0), and the variable i is set to 1. Furthermore, the variable prev is set to the pre-determined value of the variable X, which will be used to inspect only the first word of the compressed data for this slice in the REPEAT mode. The logic flow now travels to a decision block 422.

Decision block 422 determines whether or not the bit at the "cnt" position for the variable data[0] is set to Logic 1. If the answer is YES, then the logic flow is directed to a function block 424 which retrieves the value of the previous word (at the position [i−1]). By doing so, the uncompressed data for this current word position will be loaded with the same data as the previous word position at (i−1), and the logic flow is then directed to a function block 428.

If the result at decision block 422 was NO, then a function block 426 will retrieve the data for the current word from the compressed data at the position i. After this occurs, the value for the variable i is incremented. The logic flow is now directed to a function block 428, where the variable prev is loaded with the contents of the current data word, known as the variable out[cnt]. The variable cnt is then incremented. The logic flow now travels to a decision block 430.

At decision block 430, it is determined if the end of the slice has been reached, by asking whether or not the variable cnt is less than the height of the slice (e.g., in words, such as a slice having thirteen (13) words). If the answer is YES, then the logic flow is directed back to decision block 422 for operation on the next data word for this slice. If the result is NO, the logic flow is directed to "end" block 432.

Once the end of this flow chart in FIG. 10 is reached, a slice containing all of the necessary data words will have been created from the compressed data that was originally derived from the variable data[0]. If the USE-X mode was used to compress a particular slice, then the compressed data contained only words that were not equal to the variable X, and so during the decompression step depicted on the flow chart of FIG. 10, additional data words having a value equal to X had to be inserted into the compressed data to arrive at the appropriate uncompressed data to make up an entire slice.

If the particular slice used the REPEAT mode, then the compressed data was directly used to create additional words to be inserted directly after previous words having the exact same data, which was repeated at least one time.

It will be understood that different data compression techniques could be used for FIGS. 9 and 10 without departing from the principles of the present invention. Furthermore, it will be understood that more than two data compression/decompression techniques could be used for each slice of print data in the determination to find which data technique is most efficient. Of course, if more than two compression/decompression techniques are analyzed for each slice, then more than one binary bit of information would be required to act as the indication of which "mode" was selected at the compression step.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

I claim:

1. A method of compressing data to be printed, comprising:

(a) dividing initial print data of any type, including non-character print data, into a plurality of swaths of print information, each of said swaths containing a plurality of slices, and each of said slices having a plurality of bits representing pels to be printed;

(b) analyzing and, where appropriate compressing each individual one of said plurality of slices, using at least one data compression technique controlled by a processing circuit, and temporarily storing the resulting compressed data in a memory circuit as a plurality of compressed slices, such that when two different data compression techniques are used on each of said individual slices, each individual slice is examined to see which of the two different data compression techniques is more efficient in compressing the data for that particular slice, and then a compressed slice is created and stored using the more efficient of the two different data compression techniques for each of said plurality of slices; and (c) decompressing where appropriate, using a corresponding data decompression technique that is compatible with said at least one data compression technique, each individual one of said plurality of compressed slices, thereby generating a plurality of uncompressed slices of print information for each of said swaths that are equivalent to said initial slices of print data before compression occurred, and presenting said equivalent print data of any type, including non-character print data, to a printing apparatus, such that the appropriate one of two different data decompression techniques that corresponds to said two different data compression techniques is used on each said individual compressed slice.

2. The method as recited in claim 1, wherein either of said two different data compression techniques may be used to compress any individual one of said slices in which the efficiency of compression by both said different data compression techniques provides an equal result for such slice.

3. The method as recited in claim 1, wherein, of the two different data compression techniques, a first compression technique comprises a USE-X mode, and a second compression technique comprises a REPEAT mode.

4. The method as recited in claim 3, wherein said USE-X mode compression technique comprises creating a control word, for each of said plurality of slices, containing a plurality of control bits having a position "i" within said control word, in which each said control bit "i" represents one data word of said individual uncompressed slice, and wherein each control bit "i" is set to binary 1 if the data value for its corresponding data word is equal to the data value of a pre-determined variable "X," and is cleared to binary 0 if the data value for its corresponding data word is not equal to the data value of said pre-determined variable "X;" and wherein said compressed slice comprises said control word and each data word that was not equal to the data value of said pre-determined variable "X."

5. The method as recited in claim 4, wherein said decompressing step for said USE-X mode comprises (a) inspecting said control word for each of said plurality of compressed slices, (b) for each said control bit "i" set to binary 1 of each compressed slice's control word, inserting the data value of said pre-determined variable "X" into the appropriate word location "i" within said compressed slice, (c) for each said control bit "i" cleared to binary 0 of each compressed slice's control word, inserting the data value existing in said compressed slice at the appropriate word location "i," and (d) deleting said control word from said compressed slice, thereby generating an uncompressed slice having bit data equivalent to its initial state before said compressing/decompressing steps.

6. The method as recited in claim 3, wherein said REPEAT mode compression technique comprises creating a control word, for each of said plurality of slices, containing a plurality of control bits having a position "i" within said control word, in which each said control bit "i" represents one data word of said individual uncompressed slice, and wherein each control bit "i" is set to binary 1 if the data value for its corresponding data word is equal to the data value of the immediately preceding data word at position (i−1), and is cleared to binary 0 if the data value for its corresponding data word is not equal to the data value of the immediately preceding data word at position (i−1), except for the very first data word of said individual uncompressed slice in which the first control bit "i" is set to binary 1 if the data value for its corresponding data word is equal to the data value of a pre-determined variable "X," and the first control bit "i" is cleared to binary 0 if the data value for its corresponding data word is not equal to the data value of said pre-determined variable "X;" and wherein said compressed slice comprises said control word and each data word that was not equal to the data value of the immediately preceding data word at position (i−1), and the very first data word of said individual uncompressed slice in the event that its data value was not equal to the data value of said pre-determined variable "X."

7. The method as recited in claim 6, wherein said decompressing step for said REPEAT mode comprises (a) inspecting said control word for each of said plurality of compressed slices, (b) for each said control bit "i" set to binary 1 of each compressed slice's control word, inserting the data value of said immediately preceding data word at position (i−1) into the appropriate word location "i" within said compressed slice, (c) for each said control bit "i" cleared to binary 0 of each compressed slice's control word, inserting the data value existing in said compressed slice at the appropriate word location "i," (d) for the very first control bit "i" of each compressed slice's control word, if set to binary 1, inserting the data value of said pre-determined variable "X," and if cleared to binary 0, inserting the data value existing in said compressed slice at the appropriate word location "0," and (e) deleting said control word from said compressed slice, thereby generating an uncompressed slice having bit data equivalent to its initial state before said compressing/decompressing steps.

8. A printing system having a host computer, a printer, and a communications link therebetween, said system comprising:

(a) a host computer having a first processing circuit, a first memory circuit, and a first communications port, wherein said first processing circuit is configured to compress a first data set of bitmap print data stored in said first memory circuit by:

(i) dividing initial print data of any type, including non-character print data, into a plurality of swaths of print information, each of said swaths containing a plurality of slices, and each of said slices having a plurality of bits representing pels to be printed; and (ii) analyzing and, where appropriate compressing, using at least one data compression technique controlled by said first processing circuit, each individual one of said plurality of slices and temporarily storing the resulting compressed data in said first memory circuit as a plurality of compressed slices, such that when two different data compression techniques are used on each of said individual slices, each individual slice is examined to see which of the two different data compression techniques is more efficient in compressing the data for that particular slice, and then a compressed slice is created and stored using the more efficient of the two different data compression techniques for each of said plurality of slices, thereby creating a second data set that contains compressed print data;

said first processing circuit being further configured to send said second data set to said first communications port;

(b) a communications link that is operatively connected to said first communications port and that receives data from said first communications port; and (c) a printer having a second processing circuit, a second memory circuit, a second communications port and a print engine, said second communications port being operatively connected to said communications link and receiving data from said communications link, wherein said second processing circuit is configured to decompress said second data set by:

(i) temporarily storing in said second memory circuit said second data set, (ii) decompressing where appropriate, using a corresponding data decompression technique that is compatible with said at least one data compression techniques, each individual one of said plurality of compressed slices of said second data set, thereby generating a plurality of uncompressed slices of print information for each of said swaths that are equivalent to said initial slices of print data before compression occurred, such that the appropriate one of two different data decompression techniques that corresponds to said two different data compression techniques is used on each said individual compressed slice, thereby creating a third data set that contains uncompressed print data of any type, including non-character print data; and (iii) transmitting, swath by swath, to said print engine said third data set of uncompressed print data;

thereby printing an entire page which has an identical appearance according to said first data set of bitmap print data.

9. The printing system as recited in claim 8, wherein, of the two different data compression techniques, a first compression technique comprises a USE-X mode, and a second compression technique comprises a REPEAT mode.

10. The printing system as recited in claim 9, wherein said first processing circuit is configured to perform said USE-X mode compression technique by creating a control word, for each of said plurality of slices, containing a plurality of control bits having a position "i" within said control word, in which each said control bit "i" represents one data word of said individual uncompressed slice, and wherein each control bit "i" is set to binary 1 if the data value for its corresponding data word is equal to the data value of a pre-determined variable "X," and is cleared to binary 0 if the data value for its corresponding data word is not equal to the data value of said pre-determined variable "X;" and wherein said compressed slice comprises said control word and each data word that was not equal to the data value of said pre-determined variable "X."

11. The printing system as recited in claim 10, wherein said second processing circuit is further configured to perform said USE-X mode decompression technique by (a) inspecting said control word for each of said plurality of compressed slices, (b) for each said control bit "i" set to binary 1 of each compressed slice's control word, inserting the data value of said pre-determined variable "X" into the appropriate word location "i" within said compressed slice, (c) for each said control bit "i" cleared to binary 0 of each compressed slice's control word, inserting the data value existing in said compressed slice at the appropriate word location "i," and (d) deleting said control word from said compressed slice, thereby generating an uncompressed slice having bit data equivalent to its initial state before said compressing/decompressing steps.

12. The printing system as recited in claim 9, wherein said first processing circuit is configured to perform said REPEAT mode compression technique by creating a control word, for each of said plurality of slices, containing a plurality of control bits having a position "i" within said control word, in which each said control bit "i" represents one data word of said individual uncompressed slice, and wherein each control bit "i" is set to binary 1 if the data value for its corresponding data word is equal to the data value of the immediately preceding data word at position (i−1), and is cleared to binary 0 if the data value for its corresponding data word is not equal to the data value of the immediately preceding data word at position (i−1), except for the very first data word of said individual uncompressed slice in which the first control bit "i" is set to binary 1 if the data value for its corresponding data word is equal to the data value of a pre-determined variable "X," and the first control bit "i" is cleared to binary 0 if the data value for its corresponding data word is not equal to the data value of said pre-determined variable "X;" and wherein said compressed slice comprises said control word and each data word that was not equal to the data value of the immediately preceding data word at position (i−1), and the very first data word of said individual uncompressed slice in the event that its data value was not equal to the data value of said pre-determined variable "X."

13. The printing system as recited in claim 12, wherein said second processing circuit is further configured to perform said REPEAT mode decompression technique by (a) inspecting said control word for each of said plurality of compressed slices, (b) for each said control bit "i" set to binary 1 of each compressed slice's control word, inserting the data value of said immediately preceding data word at position (i−1) into the appropriate word location "i" within said compressed slice, (c) for each said control bit "i" cleared to binary 0 of each compressed slice's control word, inserting the data value existing in said compressed slice at the appropriate word location "i," (d) for the very first control bit "i" of each compressed slice's control word, if set to binary 1, inserting the data value of said pre-determined variable "X," and if cleared to binary 0, inserting the data value existing in said compressed slice at the appropriate word location "0," and (e) deleting said control word from said compressed slice, thereby generating an uncompressed slice having bit data equivalent to its initial state before said compressing/decompressing steps.

* * * * *